United States Patent
Lee

(10) Patent No.: US 12,041,731 B2
(45) Date of Patent: Jul. 16, 2024

(54) MULTILAYER CIRCUIT BOARD MANUFACTURING APPARATUS

(71) Applicant: HAESUNG DS CO., LTD., Gyeongsangnam-do (KR)

(72) Inventor: Sang Min Lee, Gyeongsangnam-do (KR)

(73) Assignee: HAESUNG DS CO., LTD, Gyeongsangnam-Do (KR)

( * ) Notice: Subject to any disclaimer, the term of this patent is extended or adjusted under 35 U.S.C. 154(b) by 0 days.

(21) Appl. No.: 17/935,219

(22) Filed: Sep. 26, 2022

(65) Prior Publication Data
US 2023/0114747 A1    Apr. 13, 2023

(30) Foreign Application Priority Data
Sep. 30, 2021    (KR) .................. 10-2021-0130304

(51) Int. Cl.
*H05K 3/46*      (2006.01)
*H01L 23/498*    (2006.01)
*H05K 1/03*      (2006.01)

(52) U.S. Cl.
CPC ..... *H05K 3/4673* (2013.01); *H01L 23/49822* (2013.01); *H05K 1/036* (2013.01); *H05K 1/0373* (2013.01)

(58) Field of Classification Search
CPC .... H05K 3/4673; H05K 1/0373; H05K 1/036; H01L 23/49822; H01L 21/4857; H01L 21/4846
See application file for complete search history.

(56) References Cited

U.S. PATENT DOCUMENTS

| | | | | |
|---|---|---|---|---|
| 4,478,673 A * | 10/1984 | Plocher | .................. | B30B 7/023 |
| | | | | 414/277 |
| 4,698,192 A * | 10/1987 | Kuze | ..................... | C04B 41/009 |
| | | | | 101/232 |
| 5,442,142 A * | 8/1995 | Hayashi | ............... | H01R 12/523 |
| | | | | 174/250 |
| 6,000,124 A * | 12/1999 | Saito | .................... | H05K 3/4638 |
| | | | | 29/721 |
| 6,401,001 B1 * | 6/2002 | Jang | ....................... | B33Y 50/02 |
| | | | | 204/192.15 |
| 6,498,319 B1 * | 12/2002 | Matsumoto | .......... | H01L 21/481 |
| | | | | 219/121.72 |

(Continued)

FOREIGN PATENT DOCUMENTS

CN    113068392    7/2021
CN    110248810    8/2021

(Continued)

*Primary Examiner* — William H. Mayo, III
*Assistant Examiner* — Rhadames Alonzo Miller
(74) *Attorney, Agent, or Firm* — Perman & Green, LLP

(57) ABSTRACT

The present disclosure relates to a multilayer circuit board manufacturing apparatus. The present disclosure includes: uncoiler configured to provide a member; a process unit configured to perform a process on the member provided from the uncoiler; a recoiler configured to wind the member on which the process is completed in the process unit; and a tension adjustment unit which is located in at least one of the uncoiler, the recoiler, a region between the uncoiler and the process unit, and a region between the process unit and the recoiler, and adjusts tension of the member.

14 Claims, 25 Drawing Sheets

(56) References Cited

U.S. PATENT DOCUMENTS

| | | | |
|---|---|---|---|
| 9,327,452 B2* | 5/2016 | Mark | B29C 64/40 |
| 10,016,942 B2* | 7/2018 | Mark | B29C 64/106 |
| 10,076,876 B2* | 9/2018 | Mark | B29C 48/92 |
| 10,099,427 B2* | 10/2018 | Mark | B29C 64/106 |
| 10,953,610 B2* | 3/2021 | Mark | B29C 64/209 |
| 11,148,409 B2* | 10/2021 | Mark | B29C 64/118 |
| 2002/0162628 A1* | 11/2002 | Yamasaki | B32B 38/0004 |
| | | | 156/701 |
| 2004/0145858 A1* | 7/2004 | Sakurada | H05K 3/4664 |
| | | | 361/600 |
| 2004/0226745 A1* | 11/2004 | En | H05K 3/423 |
| | | | 174/262 |
| 2005/0153249 A1* | 7/2005 | Yamaguchi | H05K 3/102 |
| | | | 430/319 |
| 2007/0065639 A1* | 3/2007 | Iida | G03G 15/6591 |
| | | | 428/141 |
| 2007/0171078 A1* | 7/2007 | Cotton | G06K 19/0723 |
| | | | 700/225 |
| 2007/0248798 A1* | 10/2007 | Tsuruoka | H05K 3/125 |
| | | | 428/457 |
| 2009/0085706 A1* | 4/2009 | Baarman | H01F 5/003 |
| | | | 336/200 |
| 2009/0098478 A1* | 4/2009 | Ryu | H05K 3/428 |
| | | | 430/258 |
| 2013/0181110 A1* | 7/2013 | Sievers | H01L 31/022408 |
| | | | 250/206 |
| 2015/0223344 A1* | 8/2015 | Lazaro Gallego | |
| | | | H05K 13/0069 |
| | | | 29/760 |
| 2017/0006699 A1* | 1/2017 | Mizutani | H05K 3/4038 |
| 2017/0154707 A1* | 6/2017 | Abe | B29C 48/154 |
| 2018/0134025 A1* | 5/2018 | Nakashima | B29C 66/91933 |
| 2021/0358288 A1* | 11/2021 | Boumenir | G08B 21/18 |

FOREIGN PATENT DOCUMENTS

| | | | | |
|---|---|---|---|---|
| JP | 20011171897 | | 6/2001 | |
| KR | 20120032330 A | * | 9/2010 | B65H 19/2223 |
| KR | 20130070753 A | * | 12/2011 | B65G 39/02 |
| KR | 1020120032330 | | 4/2012 | |
| KR | 20130070753 | | 6/2013 | |
| KR | 1020160013555 | | 2/2016 | |
| KR | 20180032281 A | * | 9/2016 | H01L 21/0228 |
| KR | 20180032281 | | 3/2018 | |
| KR | 20190068060 | | 6/2019 | |
| TW | 202031107 | | 8/2020 | |
| TW | 202135616 | | 9/2021 | |
| WO | 2012043913 | | 4/2012 | |

* cited by examiner

FIG. 6C
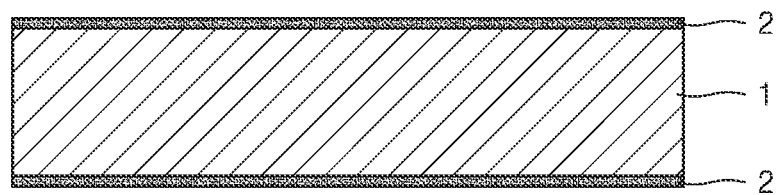
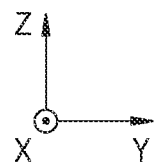

MULTILAYER CIRCUIT BOARD MANUFACTURING APPARATUS

CROSS-REFERENCE TO RELATED APPLICATION

This application is based on and claims priority under 35 U.S.C. § 119 to Korean Patent Application No. 10-2021-0130304, filed on Sep. 30, 2021, in the Korean Intellectual Property Office, the disclosure of which is incorporated by reference herein in its entirety.

BACKGROUND

1. Field

One or more embodiments relate to an apparatus, and more particularly, to a multilayer circuit board manufacturing apparatus.

2. Description of the Related Art

With the development of electronic or communication technology, electronic/communication devices, such as mobile phones, are gradually becoming smaller and higher in performance. Accordingly, circuit boards embedded in the electronic/communication devices are being manufactured as multilayer circuit boards that include multilayers to perform many functions.

Such a multilayer circuit board may be manufactured through various manufacturing processes. Here, for the multilayer circuit board, a manufacturing apparatus may be used for each manufacturing process. In addition, in the multilayer circuit board, each member may be manufactured to have a certain length and stacked to form a multilayer. In this case, since it is necessary to manufacture one multilayer circuit board and then another multilayer circuit board, it may take a lot of time to manufacture. In order to solve the limitation, various apparatuses have been developed.

SUMMARY

One or more embodiments include a multilayer circuit board manufacturing apparatus that enables continuous manufacturing.

Additional aspects will be set forth in part in the description which follows and, in part, will be apparent from the description, or may be learned by practice of the presented embodiments of the disclosure.

According to one or more embodiments, a multilayer circuit board manufacturing apparatus includes: an uncoiler configured to provide a member; a process unit configured to perform a process on the member provided from the uncoiler; a recoiler configured to wind the member on which the process is completed in the process unit; and a tension adjustment unit which is located in at least one of the uncoiler, the recoiler, a region between the uncoiler and the process unit, and a region between the process unit and the recoiler, and adjusts tension of the member.

In the embodiment, the tension adjustment unit may include: a contact roller that moves in contact with the member; and a load unit which is connected to the contact roller and adjusts force that is applied to the member by the contact roller.

In the embodiment, the tension adjustment unit may include a powder clutch which is connected to at least one of the uncoiler and the recoiler and maintains the tension of the member.

In the embodiment, the tension adjustment unit may include a speed adjustment unit which is located in at least one of the uncoiler and the recoiler and adjusts a speed of at least one of the uncoiler and the recoiler.

In the embodiment, the multilayer circuit board manufacturing apparatus may further include a position adjustment unit which is located between the uncoiler and the recoiler and adjusts a position of the member.

In the embodiment, the multilayer circuit board manufacturing apparatus further include member connection units which are located between the uncoiler and the process unit and between the recoiler and the process unit and connect an end of the member to an end of a new member.

In the embodiment, the multilayer circuit board manufacturing apparatus may further include stopper units which are located between the uncoiler and the process unit and between the recoiler and the process unit and prevent the member from moving.

In the embodiment, the multilayer circuit board manufacturing apparatus may further include a transfer roller which is located between the uncoiler and the recoiler and is in contact with the member when the member is transferred.

In the embodiment, the transfer roller may include: a roller body; and a protrusion located on the roller body and protruding from the roller body.

In the embodiment, the protrusion may include: a pair of first protrusions located at ends of the roller body; and a second protrusion which is located between the first protrusions and has a width less than a width of each of the first protrusions.

In the embodiment, the transfer roller may be provided in plurality, and the plurality of transfer rollers may include: a first transfer roller which faces a first surface of the member; and a second transfer roller which faces a second surface of the member and blocks, in conjunction with the first transfer roller, a product region of the member from the outside.

In the embodiment, the first transfer roller and the second transfer roller may be arranged perpendicular to the ground.

In the embodiment, the process unit may perform at least one of a development process, an etching process, a brown oxide process, a plating process, and an exfoliating process.

In the embodiment, the process unit may include: a liquid chemical supply unit configured to supply a liquid chemical to the member; a plurality of first rollers configured to transfer the member; and a second roller which prevents the liquid chemical supplied from the liquid chemical supply unit from moving while guiding the liquid chemical supplied from the liquid chemical supply unit, and which has a diameter less than a diameter of each of the first rollers.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
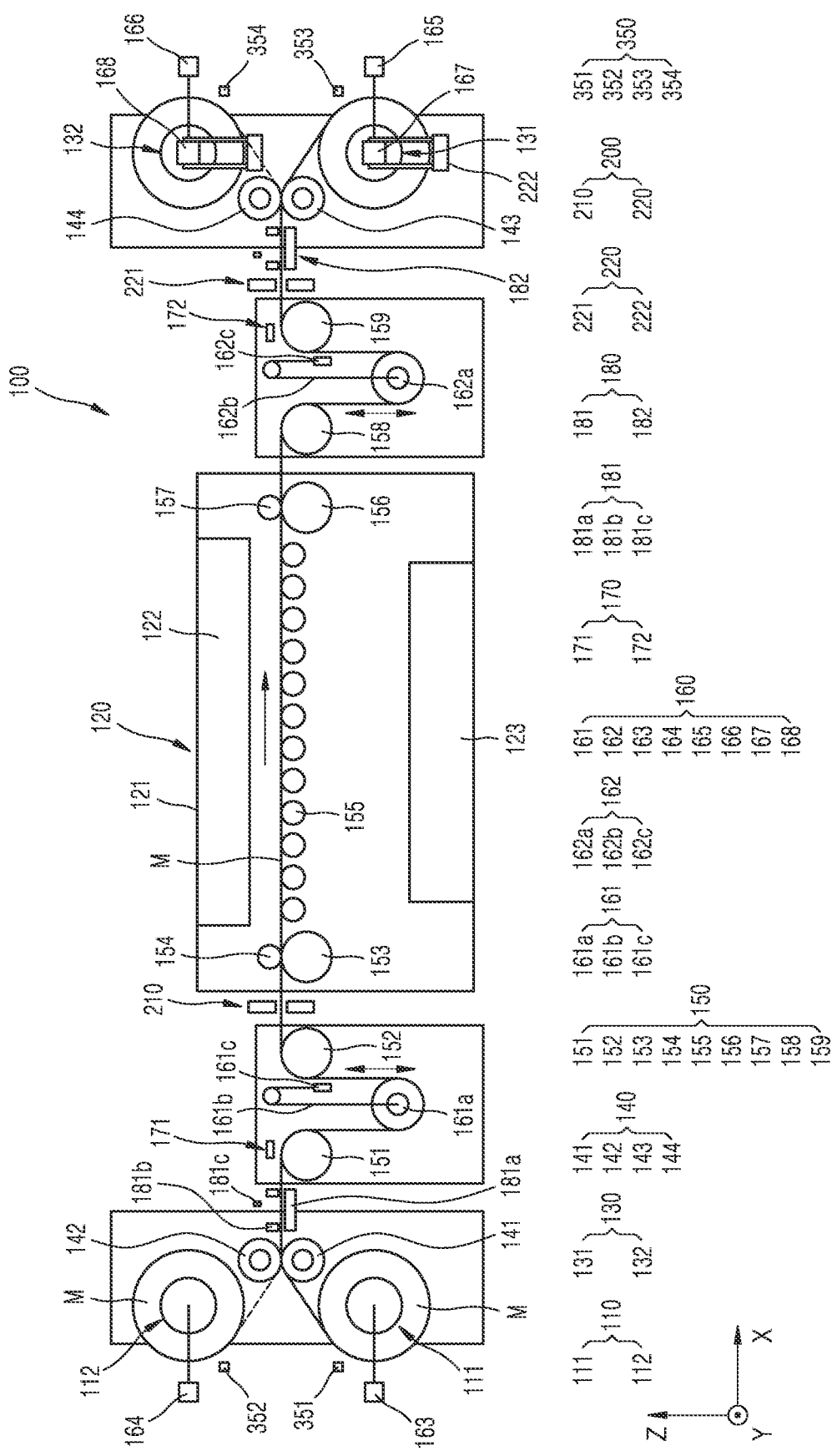
FIG. 1 is a front view showing an embodiment of a multilayer circuit board manufacturing apparatus according to an embodiment of the present disclosure.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The present disclosure will be clarified through following embodiments described in detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims. Meanwhile, the terms used in this specification are used only to explain embodiments while not limiting the present disclosure. In this specification, the singular forms include the plural forms as well, unless the context clearly indicates otherwise. The meaning of "comprises" and/or "comprising" used in the specification does not exclude the presence or addition of one or more components, steps, operations, and/or elements other than the mentioned components, steps, operations, and/or elements. It will be understood that although the terms of first and second are used herein to describe various elements, these elements should not be limited by these terms. Terms are only used to distinguish one component from other components.

FIG. 1 is a front view showing an embodiment of a multilayer circuit board manufacturing apparatus according to an embodiment of the present disclosure.

Referring to FIG. 1, a multilayer circuit board manufacturing apparatus 100 may include an uncoiler 110, a process unit 120, a recoiler 130, a bending roller 140, a transfer roller 150, a tension maintaining unit 160, a stopper unit 170, a member connection unit 180, a position adjustment unit 200, and a sensor unit 350.

The uncoiler 110 may supply a member M that is wound thereon. Here, the uncoiler 110 may include a roller that is rotated manually. In another embodiment, an uncoiler 110 may include a driving unit, such as a separate motor, and rotate automatically and unwind a member M. The driving unit provided in the uncoiler 110 may include a step motor and the like. Hereinafter, for convenience of description, the uncoiler 110, which includes a manually rotated roller without including a separate driving unit, will be described in detail.

The uncoiler 110 may be provided in plurality. Here, the plurality of uncoilers 110 may be spaced apart from each other. Different members may be disposed on the uncoilers 110 and laminated into a single member in the process unit 120. In another embodiment, the same member M may be disposed on each of the uncoilers 110. Thus, when the member M supplied from one uncoiler 110 is exhausted, the member M may be supplied from another uncoiler 110. Hereinafter, for convenience of description, the plurality of uncoilers 110 supplying the same member M will be described in detail.

The plurality of uncoilers 110 may include a first uncoiler 111 and a second uncoiler 112. The first uncoiler 111 may supply the member M first. Here, when the member M supplied from the first uncoiler 111 is completely exhausted, the process may be continuously performed by connecting the member M wound around the second uncoiler 112 to the end of the member M supplied from the first uncoiler 111.

In addition to the above case, although not illustrated in the drawings, when the uncoiler 110 is provided in plurality, the uncoilers 110 may supply different members M. In this case, the plurality of uncoilers 110 may simultaneously supply the process unit 120 with different members M.

The process unit 120 may perform various processes. For example, the process unit 120 may include a lamination device that laminates a plurality of different members. In another embodiment, the process unit 120 may include a development device that develops a dry film photoresist. In another embodiment, the process unit 120 may include an exfoliating device that peels off a dry film photoresist. In another embodiment, the process unit 120 may include an etching device that performs an etching process for removing a portion of the member M. In another embodiment, the process unit 120 may include an oxidizing device that performs a brown oxide process on the surface of the member M. In another embodiment, the process unit 120 may include a foreign substance removal device that removes foreign substances on the surface of the member M. In another embodiment, the process unit 120 may include a plating device that forms a plating layer on the member M. Here, the process unit 120 is not limited to the above devices, and devices or facilities used in processes for manufacturing the multilayer circuit board may be disposed therein.

The process unit 120 described above may include: a process chamber 121 in which the processes are performed; and process performing units 122 and 123 which are located inside the process chamber 121 and perform the processes described above. In this case, although not illustrated in the drawings, the process chamber 121 may be provided with an opening region through which the member M passes. The process performing units 122 and 123 may have various shapes according to the processes to be performed.

The process performing units 122 and 123 may include a first process performing unit 122 and a second process performing unit 123. Here, the first process performing unit 122 may perform a process on one surface of the member M, and the second process performing unit 123 may perform a process on the other surface of the member M. In this case, it is possible to simultaneously perform processes on both surfaces of the member M.

The recoiler 130 may wind the member M in which the process has been completed by passing through the process unit 120. Here, the recoiler 130 may separately include a driving unit for winding the member M.

The recoiler 130 may be provided in plurality. Here, at least one of the plurality of recoilers 130 may wind the member M in which the process has been completed. Also, another one of the plurality of recoilers 130 may be in a standby state and winds a process-completed member M when the process-completed member M reaches a certain diameter in at least one of the plurality of recoilers 130.

The plurality of recoilers 130 may include a first recoiler 131 and a second recoiler 132. Here, the first recoiler 131 may wind the process-completed member M first, and the second recoiler 132 may be used when the first recoiler 131 is not used.

The first recoiler 131 and the second recoiler 132 may be connected to a first speed adjustment unit 167 and a second speed adjustment unit 168, respectively. Here, the first speed adjustment unit 167 and the second speed adjustment unit 168 may change rotation speeds according to the diameters of the member M wound around the first recoiler 131 and the second recoiler 132, respectively. In this case, each of the first speed adjustment unit 167 and the second speed adjustment unit 168 may include a stepping motor.

The bending roller 140 may bend the member M that is connected to at least one of the uncoiler 110 and the recoiler 130. For example, the bending roller 140 may include: a first bending roller 141 located between the first uncoiler 111 and the process unit 120; a second bending roller 142 located between the second uncoiler 112 and the process unit 120; a third bending roller 143 located between the first recoiler 131 and the process unit 120; and a fourth bending roller 144 located between the second roller 132 and the process unit 120.

The bending roller 140 may maintain the tension of the member M by bending a path of the member M. The first bending roller 141 or the second bending roller 142 may change the path of the member M supplied from the uncoiler 110 and change the movement path of the member M so that the member M may pass through one flat surface. The third bending roller 143 or the fourth bending roller 144 may change the path of the member M that is moving to the recoiler 130. Accordingly, the member M may be moved in a direction tangent to the member M wound around the recoiler 130 or the surface of the recoiler 130, and thus, the member M may be smoothly wound around the recoiler 130.

The transfer roller 150 is located between the uncoiler 110 and the recoiler 130, and may support the member M or facilitate the movement of the member M when the member M is transferred. Here, the transfer roller 150 may be provided in plurality, and the plurality of transfer rollers 150 may be arranged spaced apart from each other in the direction in which the member M moves.

In an embodiment, the plurality of transfer rollers 150 may be disposed in contact with only one surface of the member M. Here, the plurality of transfer rollers 150 may be arranged spaced apart from each other in the direction in which the member M moves. In another embodiment, one of the plurality of transfer rollers 150 and another one of the plurality of transfer rollers 150 may form a pair and be arranged one by one on both surfaces of the member M. In this case, a pair of process transfer rollers, such as a first process transfer roller 153 and a second process transfer roller 154, which face each other as illustrated in FIG. 1, may be provided in plurality, and the plurality of pairs of process transfer rollers may be arranged spaced apart from each other in the movement direction of the member M. In another embodiment, some of the plurality of transfer rollers 150 may be disposed on one surface of the member M, and the others of the plurality of transfer rollers 150 may be disposed on the other surface of the member M. For example, referring to FIG. 1, some of the plurality of transfer rollers 150 may be disposed on the upper surface of the member M, and the others of the plurality of transfer rollers 150 may be disposed on the lower surface of the member M.

In this case, the plurality of transfers roller 150 are arranged at different positions and arranged in a zigzag shape. In another embodiment, some of the plurality of transfer rollers 150 may be disposed above and below the member M in the form of pairs, and some of the plurality of transfer rollers 150 may be disposed only below the member M. The arrangements of the plurality of transfers roller 150 are not limited to those described above and may be varied in consideration of the processes and support of the member M. Hereinafter, however, for convenience of description, the plurality of transfer rollers 150 arranged as illustrated in FIG. 1 will be described in detail.

The plurality of transfer rollers 150 may include, according to the positions, a first front transfer roller 151, a second front transfer roller 152, a first process transfer roller 153, a second process transfer roller 154, a third process transfer roller 155, a fourth process transfer roller 156, a fifth process transfer roller 157, a first rear transfer roller 158, and a second rear transfer roller 159.

The first front transfer roller 151 and the second front transfer roller 152 may be located on both side surfaces of a first tension maintaining unit 161, which will be described later, and support the member M. Here, the first front transfer roller 151 and the second front transfer roller 152 may support the points at which the member M is bent.

The first rear transfer roller 158 and the second rear transfer roller 159 may be located on both side surfaces of a second tension maintaining unit 162, which will be described later, and support the member M. The first rear transfer roller 158 and the second rear transfer roller 159 may support the points at which the member M is bent.

At least one process transfer roller may be located in the process unit 120 described above. Here, when the process transfer roller is provided in plurality, the plurality of process transfer rollers may be arranged spaced apart from each other in the direction in which the member M is transferred. The plurality of process transfer rollers may be spaced apart from each other in various ways. Here, the plurality of process transfer rollers may be arranged in the same or similar manner to the plurality of transfer rollers 150 described above. Hereinafter, for convenience of description, the plurality of process transfer rollers, which include a first process transfer roller 153, a second process transfer roller 154, a third process transfer roller 155, a fourth process transfer roller 156, and a fifth process transfer roller 157, will be described in detail.

The first process transfer roller 153 and the second process transfer roller 154 may face each other. Here, the first process transfer roller 153 and the second process transfer roller 154 may be disposed on one surface of the member M and the other surface of the member M, respectively, and may move the member M.

In the above case, the diameter of the first process transfer roller 153 may be equal to or different from the diameter of the second process transfer roller 154. In an embodiment, the diameter of the first process transfer roller 153 may be equal to the diameter of the second process transfer roller 154. In another embodiment, the diameter of the first process transfer roller 153 may be greater than the diameter of the second process transfer roller 154. In another embodiment, the diameter of the first process transfer roller 153 may be less than the diameter of the second process transfer roller 154.

The third process transfer roller 155 may support the member M which has passed through the first process transfer roller 153 and the second process transfer roller 154. Here, at least one third process transfer roller 155 may be provided. Hereinafter, for convenience of description, the third process transfer roller 155, which is provided in plurality, will be described in detail.

The fourth process transfer roller 156 and the fifth process transfer roller 157 may be disposed on one surface of the member M and the other surface of the member M, respectively, which is similar to the first process transfer roller 153 and the second process transfer roller 154. Here, the relationship between the diameter of the fourth process transfer roller 156 and the diameter of the fifth process transfer roller 157 may be the same as or similar to the relationship between the diameter of the first process transfer roller 153 and the diameter of the second process transfer roller 154 described above.

The tension maintaining unit 160 may maintain the tension of the member M constant when the member M is transferred, or may maintain the tension of the member M above a certain value. The tension maintaining unit 160 described above may have various shapes. For example, the tension maintaining unit 160 may include a first tension maintaining unit 161, a second tension maintaining unit 162, a third tension maintaining unit 163, a fourth tension maintaining unit 164, a fifth tension maintaining unit 165, a sixth tension maintaining unit 166, a first speed adjustment unit 167, and a second speed adjustment unit 168.

The first tension maintaining unit 161 may be located between the first front transfer roller 151 and the second front transfer roller 152. Here, the first tension maintaining unit 161 may apply force to the member M. Specifically, the first tension maintaining unit 161 may include a first contact roller 161a, a first connection unit 161b, and a first load unit 161c. The first contact roller 161a is in contact with the member M and may adjust the force applied to the member M according to weight of the first load unit 161c. The first connection unit 161b may connect the first contact roller 161a to the first load unit 161c. The first load unit 161c is connected to the first connection unit 161b and may adjust the force applied to the member M by the first contact roller 161a. In the above case, the first connection unit 161b may include a wire or the like. Also, the first load unit 161c may include a weight or the like. In another embodiment, the first load unit 161c may include a weight and a device that supplies the weight with a fluid or the like. In the above case, the height of the first contact roller 161a may be adjusted through the first connection unit 161b by changing the own weight of the first load unit 161c. In another embodiment, the first tension maintaining unit 161 may include a first contact roller 161a and a first position changing unit (not shown) which is connected to the first contact roller 161a to change the position of the first contact roller 161a. Here, the first position changing unit may include driving units, such as a cylinder, a motor and a rack gear, and a linear motor.

The second tension maintaining unit 162 may be located between the first rear transfer roller 158 and the second rear transfer roller 159. Here, the second tension maintaining unit 162 may be the same as or similar to the first tension maintaining unit 161. Hereinafter, for convenience of description, the second tension maintaining unit 162, which includes a second contact roller 162a, a second connection unit 162b, and a second load unit 162c, will be described in detail.

The third tension maintaining unit 163 may be connected to the first uncoiler 111, and the fourth tension maintaining unit 164 may be connected to the second uncoiler 112. Also, the fifth tension maintaining unit 165 may be connected to at least one of the first recoiler 131 and the first speed adjustment unit 167, and the sixth tension maintaining unit 166 may be connected to at least one of the second recoiler 132 and the second speed adjustment unit 168. Here, the third tension maintaining unit 163, the fourth tension maintaining unit 164, the fifth tension maintaining unit 165, and the sixth tension maintaining unit 166 may be the same as or similar to each other. Hereinafter, for convenience of description, the third tension maintaining unit 163 will be described in detail.

The third tension maintaining unit 163 may be connected to the first uncoiler 111 to change the position of the first uncoiler 111. For example, the third tension maintaining unit 163 may include a cylinder connected to the first uncoiler 111. In another embodiment, the third tension maintaining unit 163 may include a rack gear connected to the first uncoiler 111 and a motor that linearly moves the rack gear. In another embodiment, the third tension maintaining unit 163 may include a powder clutch which includes an excitation coil and powder and changes the rotation center of the first uncoiler 111. In another embodiment, the third tension maintaining unit 163 may include a linear motor that is connected to the first uncoiler 111. Hereinafter, for convenience of description, the third tension maintaining unit 163, which includes the powder clutch, will be described in detail.

The third tension maintaining unit 163 described above may change the position of the first uncoiler 111 on the basis of a result measured in a first sensor unit 351.

The first speed adjustment unit 167 is located in the first recoiler 131 and may change the rotation speed of the first recoiler 131. Here, the first speed adjustment unit 167 may be operated on the basis of a result measured in a third sensor unit 353. The second speed adjustment unit 168 is located in the second recoiler 132 and may change the rotation speed of the second recoiler 132. Here, the second speed adjustment unit 168 may be operated on the basis of a result measured in a fourth sensor unit 354.

The stopper unit 170 may stop the member M supplied from the uncoiler 110 or stop the member M wound around the recoiler 130. Here, the stopper unit 170 may have various shapes. For example, the stopper unit 170 may be provided in the form of a robot arm and stop the movement of the member M by gripping the member M. In another embodiment, the stopper unit 170 may be raised and lowered, and may be located facing at least one of the plurality of transfer rollers 150, selectively come into contact with the member M, and prevent the member M from being transferred.

The stopper unit 170 described above may include a first stopper unit 171 located in a front region and a second stopper unit 172 located in a rear region.

The member connection unit 180 may be used to connect or cut the member M in the uncoiler 110 or used to connect or cut the member M in the recoiler 130. The member connection unit 180 may include a first member connection unit 181 and a second member connection unit 182. Here, the first member connection unit 181 and the second member connection unit 182 may be formed and operated in the same or similar manner. Therefore, hereinafter the first member connection unit 181 will be described in detail for convenience of description.

The first member connection unit 181 described above may include a first stage 181a for supporting the member M and a first contact unit 181b disposed on the first stage 181a and selectively coming into contact with the member M. Here, the first contact unit 181b is disposed facing the first stage 181a and may restrict the member M. The first member connection unit 181 may further include a first detection sensor 181c for sensing cutting of the member M, the end of the member M, partial damages of the member M, and the like. The first detection sensor 181c may include a laser sensor, an optical sensor, an ultrasonic sensor, or the like. Also, the first detection sensor 181c may be disposed on the lower surface of the first contact unit 181b or spaced separately from the first contact unit 181b.

The position adjustment unit 200 detects whether the member M moves along a preset path, and may adjust the path of the member M according to the detected result. For example, the position adjustment unit 200 may detect the path, along which an edge of the member M moves, and change the position of the member M in the width direction of the member M. Here, the position adjustment unit 200 may be located in various regions. For example, the position adjustment unit 200 may be located in at least one of between the uncoiler 110 and the process unit 120, inside the process unit 120, and between the recoiler 130 and the process unit 120. Hereinafter, for convenience of description, the position adjustment unit 200, which includes a first position adjustment unit 210 located between the uncoiler 110 and the process unit 120 and a second position adjustment unit 220 located between the recoiler 130 and the process unit 120, will be described in detail.

The first position adjustment unit 210 described above may be located between the uncoiler 110 and the process unit 120 and sense the movement path of the member M in the width direction. Although not illustrated in the drawings, the first position adjustment unit 210 may change the positions of at least one of the plurality of transfer rollers 150 and at least one of the uncoiler 110 on the basis of the position of the member M.

The second position adjustment unit 220 may include a second detection sensor 221 that senses whether the position of the member M is maintained constant in the width direction (for example, an Y axis direction in FIG. 1). For example, the second detection sensor 221 may include a laser sensor, an ultrasonic sensor, an optical sensor, or the like, which senses the edge of the member M. In another embodiment, the second detection sensor 221 may include a line sensor which is disposed facing at least one of one surface and the other surface of the member M and senses the member M. Also, the second position adjustment unit 220 may include a second path adjustment unit 222 that adjusts the position of the edge of the member M on the basis of the result sensed in the second detection sensor 221. Here, the second path adjustment unit 222 may have various shapes. For example, the second path adjustment unit 222 may include a linear guide and a driving unit that linearly moves a block disposed on the linear guide. In this case, the driving unit may be provided in various forms, such as a motor, a cylinder, a linear motor, or the like. The second path adjustment unit 222 may be located at various positions. For example, the second path adjustment unit 222 may be located in at least one of the uncoiler 110, the transfer roller 150, and the recoiler 130. Hereinafter, for convenience of description, the second path adjustment unit 222, which is located in each of the first speed adjustment unit 167 and the second speed adjustment unit 168, will be described in detail.

The sensor unit 350 may be located around at least one of the uncoiler 110 and the recoiler 130 and measure a distance to the member M. Hereinafter, for convenience of description, the sensor unit 350, which is located adjacent to all of the uncoiler 110 and the recoiler 130, will be described in detail.

In this case, a first sensor unit 351 may be located around the first uncoiler 111, and a second sensor unit 352 may be located around the second uncoiler 112. Also, a third sensor unit 353 may be located around the first recoiler 131, and a fourth sensor unit 354 may be located around the second recoiler 132.

Meanwhile, when examining operation of the multilayer circuit board manufacturing apparatus 100 described above, the members M to be used in each process are disposed on the first uncoiler 111 and the second uncoiler 112. Then, the end of the member M of the first uncoiler 111 may be connected to the first recoiler 131 along the path illustrated in FIG. 1. Subsequently, when the first speed adjustment unit 167 operates, the first recoiler 131 may wind the member M while rotating.

The process performing units 122 and 123 may perform processes on the member M that is passing through the inside of the process chamber 121. In this case, the first sensor unit 351 may sense the distance to the surface of the member M which is wound around the first uncoiler 111. In this case, when the process on the member M is continuously performed, the diameter of the member M wound around the first uncoiler 111 may be gradually reduced. Also, it may be sensed whether the member M is continuously supplied, by using the distance to the member M measured by the first sensor unit 351.

In this case, the third tension maintaining unit 163 may change the position of the first uncoiler 111 on the basis of the result sensed by the first sensor unit 351. For example, when the member M is unwound from the first uncoiler 111, the distance between the first bending roller 141 and a portion of the member (M) that starts to be unwound from the first uncoiler 111 may gradually increase. In this case, the tension of the member M between the first uncoiler 111 and the first bending roller 141 may be smaller than that in an initial or previous state. Therefore, the third tension maintaining unit 163 may move the position of the first uncoiler 111 in a direction opposite to the direction in which the member M is transferred (for example, in a −X axis direction) when compared to the initial or previous state. In addition to the above case, it is also possible to further move the first contact roller 161a in the weight direction by adjusting the first load unit 161c to have weight less than that in a previous state.

When the first speed adjustment unit 167 operates as described above, the member M, in which the process is completed, may be continuously wound around the first recoiler 131. In this case, the distance between the third sensor unit 353 and the member M wound around the first recoiler 131 may gradually decrease. On the basis of this result, the fifth tension maintaining unit 165 may move the first recoiler 131 in a direction opposite to the direction in which the member M moves. In addition to the above case, it is also possible to dispose the second contact roller 162a of the second tension maintaining unit 162 at a position higher than that in an initial or previous state, by increasing weight of the second load unit 162c of the second tension maintaining unit 162.

While the above operation is performed, when the process unit 120 does not operate properly, the member M is damaged, the member M is cut, or the like, the multilayer circuit board manufacturing apparatus 100 may stop the operation. At this moment, a first stopper unit 171 and a second stopper unit 172 may be operated to fix the position of the member M.

Also, while the above operation is performed, the second detection sensor 221 may sense the edge of the side surface of the member M. By comparing the movement path of the edge of the side surface of the member M sensed by the second detection sensor 221 with a preset movement path, it is possible to check whether the member M is wound around the first recoiler 131 after moving along the same path as the preset movement path. As a result of the check, when the preset movement path is not the same as the movement path of the edge of the side surface of the member M, the second path adjustment unit 222 may change the position of the first recoiler 131. That is, the second path adjustment unit 222 may change the position of the first recoiler 131 so that the movement path of the edge of the side surface of the member M is the same as the preset path. The above operation may be performed in not only the second position adjustment unit 220 but also the first position adjustment unit 210 in the same or similar manner.

Meanwhile, while the operation is performed as described above, the member M to be supplied to the first recoiler 131 may be completely exhausted, or a damaged or broken member M may be supplied. At this moment, when the event described above is sensed by the first detection sensor 181c, the operation of the first speed adjustment unit 167 may stop. Also, the first contact unit 181b may come into contact with the member M and restrict the member M in conjunction with the first stage 181a. Subsequently, the member M may be connected after removing the damaged or broken section of the member M as described above, or the end of a new member M may be connected to the end of the member M.

When the new member M is connected to the existing member M as described above, the member M wound around the second uncoiler 112 may be used. In this case, the second sensor unit 352 may sense the distance to the member M which is wound around the second uncoiler 112.

Even when the member M is supplied from the second uncoiler 112, the multilayer circuit board manufacturing apparatus 100 may operate in the same or similar manner to when the member M is supplied from the first uncoiler 111 as described above.

Meanwhile, when the member M is sufficiently wound around the first recoiler 131 or when the value measured by the third sensor unit 353 reaches the preset value, the operation of the multilayer circuit board manufacturing apparatus 100 may stop, and the second member connection unit 182 may be operated to restrict the member M. Subsequently, the member M may be removed, and the end of the member M close to the process unit 120 may be connected to the second recoiler 132. When the second speed adjustment unit 168 operates, the member M may be wound around the second recoiler 132.

In this case, the member M may be wound around the second recoiler 132 in the same or similar manner as when the member M is wound around the first recoiler 131 as described above.

Therefore, the multilayer circuit board manufacturing apparatus 100 may perform operation while continuously supplying the member M. Accordingly, it is possible to manufacture a printed circuit board by rapidly and effectively processing the member M. Also, the multilayer circuit board manufacturing apparatus 100 may maintain constant tension of the member M. Accordingly, it is possible to prevent bending, distortion, etc. of the member M that may occur when the member M is continuously processed.

Figure 2:
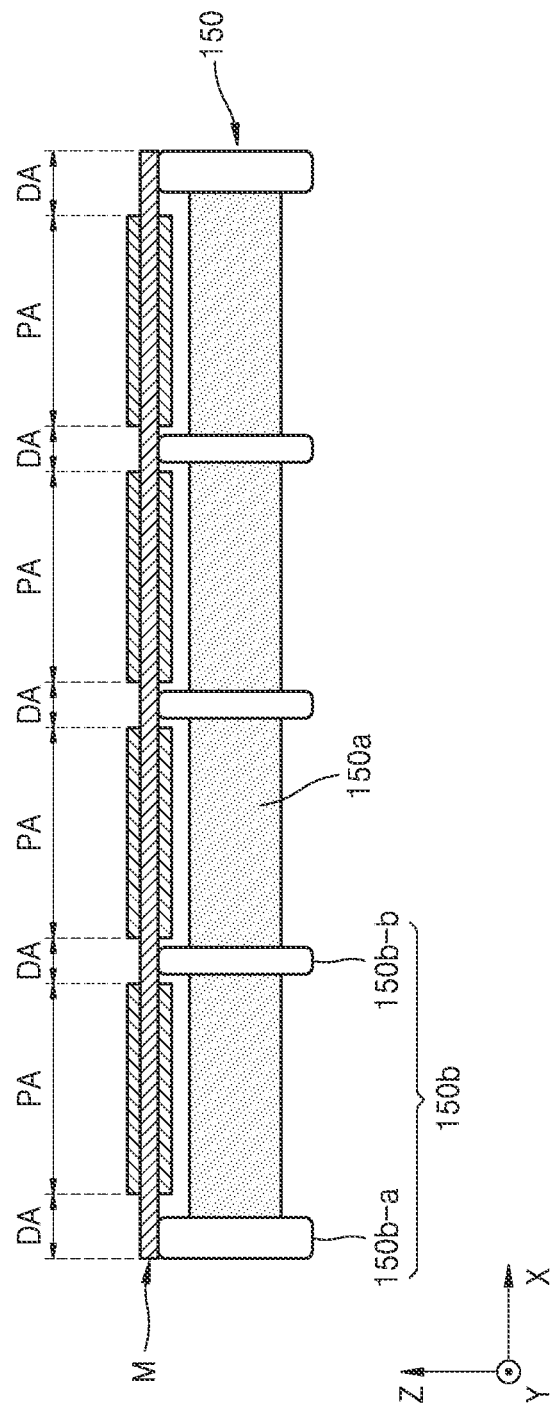
FIG. 2 is a side view showing a transfer roller illustrated in FIG. 1.

FIG. 2 is a side view showing the transfer roller illustrated in FIG. 1.

Referring to FIG. 2, a transfer roller 150 may include a roller body 150a and a protrusion 150b. The roller body 150a may be made of a rigid synthetic resin material. On the other hand, the protrusion 150b may include an elastic material, such as rubber, silicone, and a soft synthetic resin material.

The protrusion 150b may include: a pair of first protrusions 150b-a located at the ends of the roller body 150a; and a second protrusion 150b-b located between the pair of first protrusions 150b-a. The first protrusions 150b-a and the second protrusion 150b-b may have an annular shape with the same diameter. In another embodiment, the first protrusions 150b-a and the second protrusion 150b-b may be polygons having the same shape and size. In another embodiment, the first protrusions 150b-a and the second protrusion 150b-b may be ellipses having the same shape and size.

In this case, the width of each of the first protrusions 150b-a and the width of the second protrusion 150b-b, which are measured in the longitudinal direction of the roller body 150a (for example, in an X direction of FIG. 2), may be different from each other. For example, the width of the first protrusion 150b-a may be greater than the width of the second protrusion 150b-b.

In this case, the member M may include a process region PA in which a process is performed to manufacture a product. Here, the process region PA may include an uneven surface. At least one process region PA may be provided. When the plurality of process regions PA are provided, a dummy region DA, in which a separate process is not performed, may be located between the neighboring process regions PA. This dummy region DA may be in contact with the protrusion 150b. The protrusion 150b may support the member M by supporting the dummy region DA. In this case, the plurality of process regions PA may be arranged spaced apart from each other in at least one of a first direction (for example, one of the X axis direction and the Y axis direction of FIG. 2) and a second direction (for example, the other one of the X axis direction and the Y axis direction of FIG. 2).

Therefore, the transfer roller 150 may not damage structures disposed on the process regions PA of the member M and prevent contamination of the process regions PA.

Figure 3:
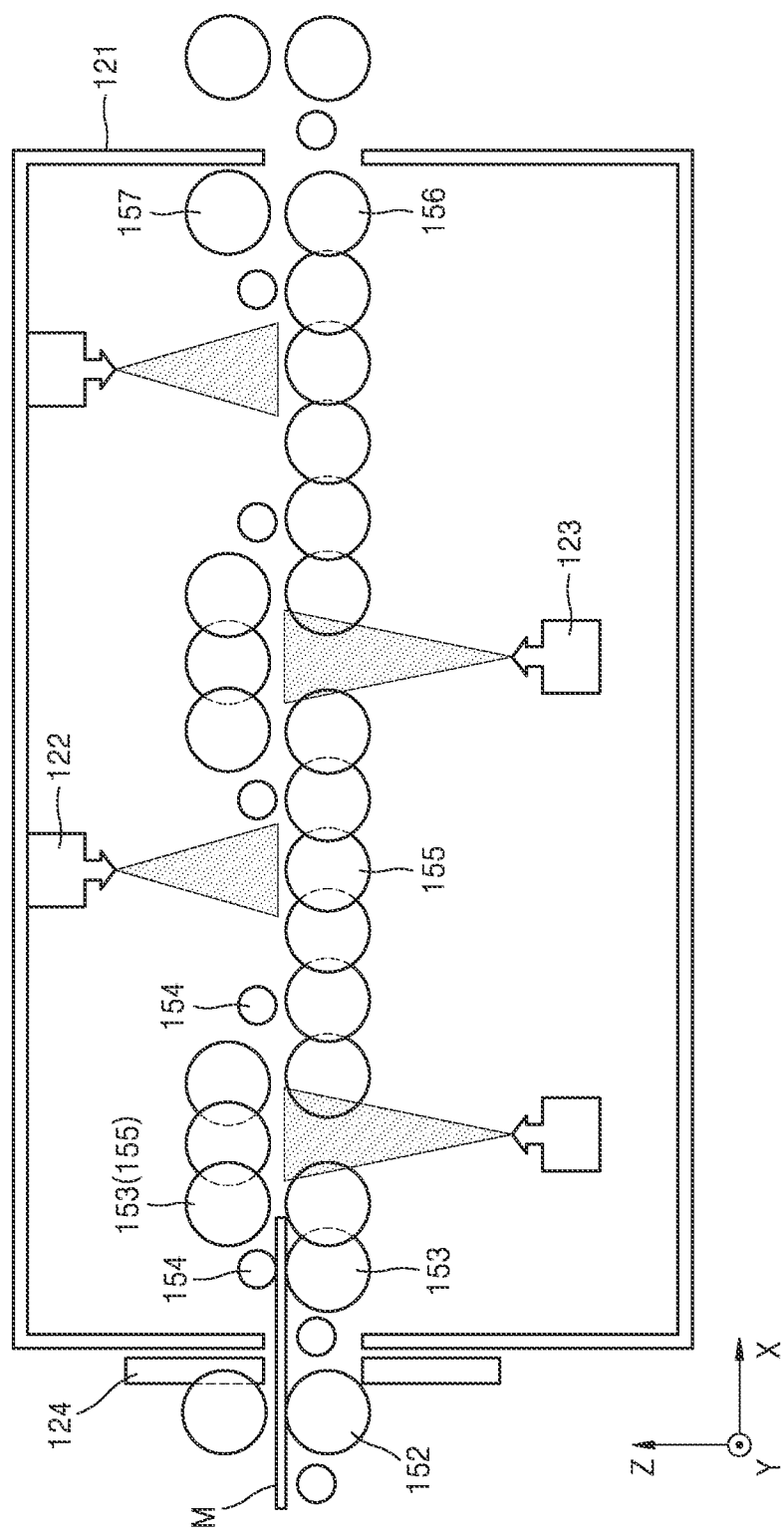
FIG. 3 is a cross-sectional view showing a process unit of a multilayer circuit board manufacturing apparatus according to an embodiment of the present disclosure.

FIG. 3 is a cross-sectional view showing a process unit of a multilayer circuit board manufacturing apparatus according to an embodiment of the present disclosure.

Referring to FIG. 3, a multilayer circuit board manufacturing apparatus (not shown) is similar to that illustrated in FIG. 1, and thus, hereinafter, a process unit 120 different from that of FIG. 1 will be described in detail.

The process unit 120 may include a process chamber 121 and process performing units 122 and 123. Here, the process performing units 122 and 123 may include a first process performing unit 122 and a second process performing unit 123. Hereinafter, the first process performing unit 122 and the second process performing unit 123 are the same as or similar to each other, and thus, the first process performing unit 122 will be described in detail.

The first process performing unit 122 may have a nozzle shape that supplies a liquid chemical. Here, the liquid chemical may include an etching solution and a cleaning solution.

In this case, a first process transfer roller 153 may transfer a member M. A second process transfer roller 154 may be disposed facing the first process transfer roller 153. In this case, the second process transfer roller 154 is located around the first process performing unit 122 or around the second process performing unit 123, and may reduce spreading or splashing of the liquid chemical, supplied from the first process performing unit 122 or the second process performing unit 123, to an undesired place. Here, the diameter of the second process transfer roller 154 may be less than the diameter of the first process transfer roller 153.

A third process transfer roller 155 may be provided in plurality and arranged spaced apart from each other inside the process chamber 121. In this case, the third process transfer rollers 155 may overlap each other when viewed in a front view. Here, when the third process transfer roller 155 has the shape illustrated in FIG. 2, first protrusions 150*b*-*a* may be arranged so as not to overlap each other, and second protrusions 150*b*-*b* may be arranged alternately with a neighboring third process transfer roller 155 so as not to overlap each other.

A fourth process transfer roller 156 and the fifth process transfer roller 157 may be arranged in the same manner as the first process transfer roller 153 and the second process transfer roller 154 illustrated in FIG. 1 or 3.

In this case, at least one of the first process transfer roller 153 and the third process transfer roller 155 may be provided in plurality on each of one surface and the other surface of the member M.

In this case, the second process transfer roller 154 is located around the first process performing unit 122 or the second process performing unit 123. Accordingly, the liquid chemical supplied from each of the process performing units 122 and 123 is allowed to stay in process regions of the member M as much as possible, and the movement of the liquid chemical to portions of the member M other than the process regions of the member M may be minimized.

Figure 4:
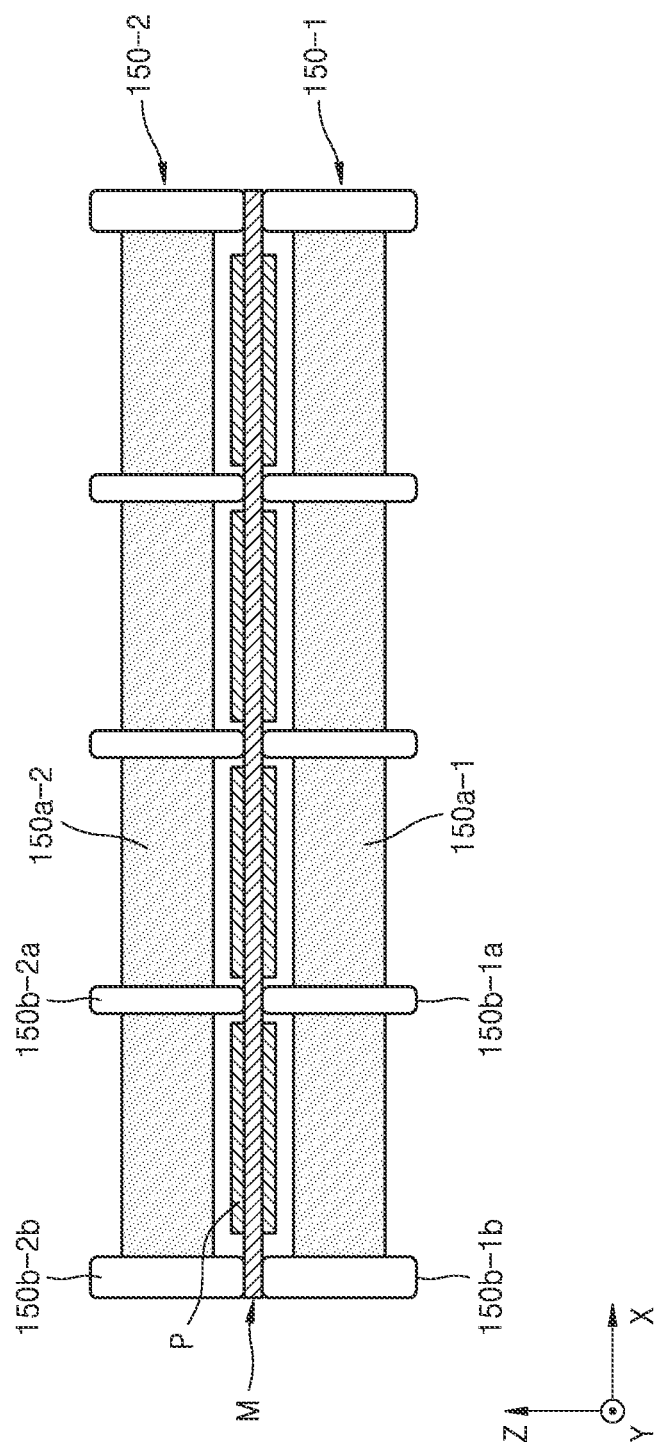
FIG. 4 is a side view showing a transfer roller of a multilayer circuit board manufacturing apparatus according to another embodiment of the present disclosure.

FIG. 4 is a side view showing a transfer roller of a multilayer circuit board manufacturing apparatus according to another embodiment of the present disclosure.

Referring to FIG. 4, a transfer roller 150 may include a first transfer roller 150-1 and a second transfer roller 150-2 which face each other. Here, the first transfer roller 150-1 may include a first roller body 150*a*-1, a first-first protrusion 150*b*-1*a*, and a first-second protrusion 150*b*-1*b*. Here, the second transfer roller 150-2 may include a second roller body 150*a*-2, a second-first protrusion 150*b*-2*a*, and a second-second protrusion 150*b*-2*b*. Here, the first transfer roller 150-1 and the second transfer roller 150-2 are the same as or similar to the transfer roller 150 illustrated in FIG. 2, and thus, detailed descriptions thereof will be omitted.

In this case, the first transfer roller 150-1 and the second transfer roller 150-2 may be disposed on the respective surfaces of a member M with the member M therebetween. Here, the first-first protrusion 150*b*-1*a*, the first-second protrusion 150*b*-1*b*, the second-first protrusion 150*b*-2*a*, the second-second protrusion 150*b*-2*b*, and the member M may form spaces so that process regions PA are arranged inside. Also, neighboring first-second protrusions 150*b*-1*b*, neighboring second-second protrusions 150*b*-2*b*, and the member M may form spaces so that process regions PA are arranged inside. In this case, the first transfer roller 150-1 and the second transfer roller 150-2 are configured such that the process regions PA are arranged between the first transfer roller 150-1 and the second transfer roller 150-2 which are adjacent to each other. Therefore, when a liquid chemical and the like are supplied to the process regions PA, the liquid chemical may stay for a long time. Furthermore, it is possible to reduce defects in the manufactured product by preventing the liquid chemical from moving to an adjacent another process region PA.

Figure 5:
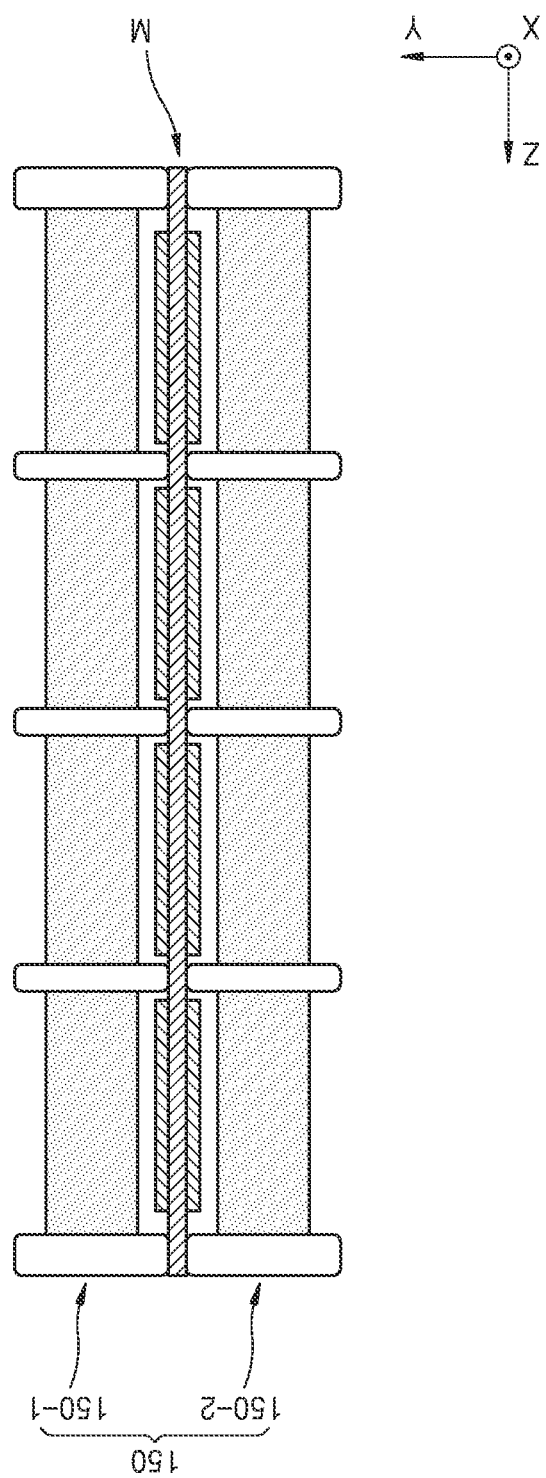
FIG. 5 is a side view showing a transfer roller of a multilayer circuit board manufacturing apparatus according to another embodiment of the present disclosure.

FIG. 5 is a side view showing a transfer roller of a multilayer circuit board manufacturing apparatus according to another embodiment of the present disclosure.

Referring to FIG. 5, a transfer roller 150 may be disposed in a direction perpendicular to the ground, unlike that illustrated in FIG. 4. Here, in the transfer roller 150, one process region PA may be distinguished from another process region PA by a first transfer roller 150-1 and a second transfer roller 150-2.

Figure 6A:
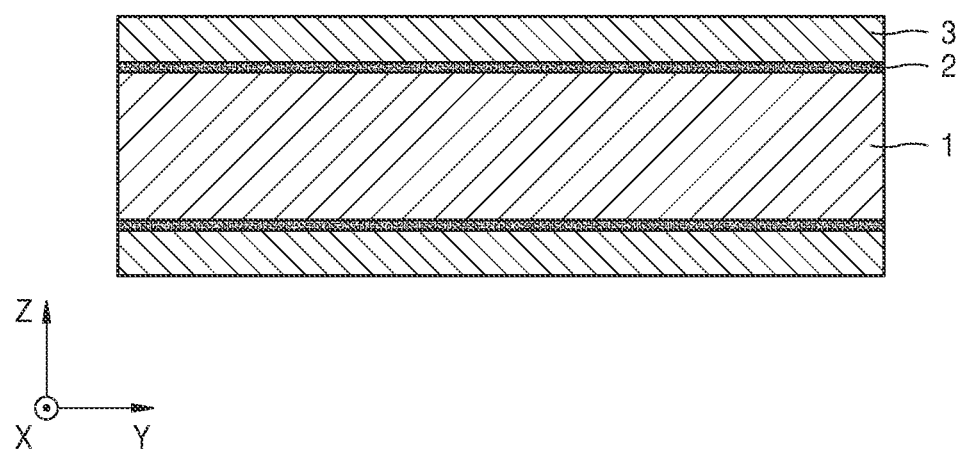
FIGS. 6A to 6T are cross-sectional views showing a manufacturing procedure for manufacturing a multilayer circuit board.
Figure 6B:
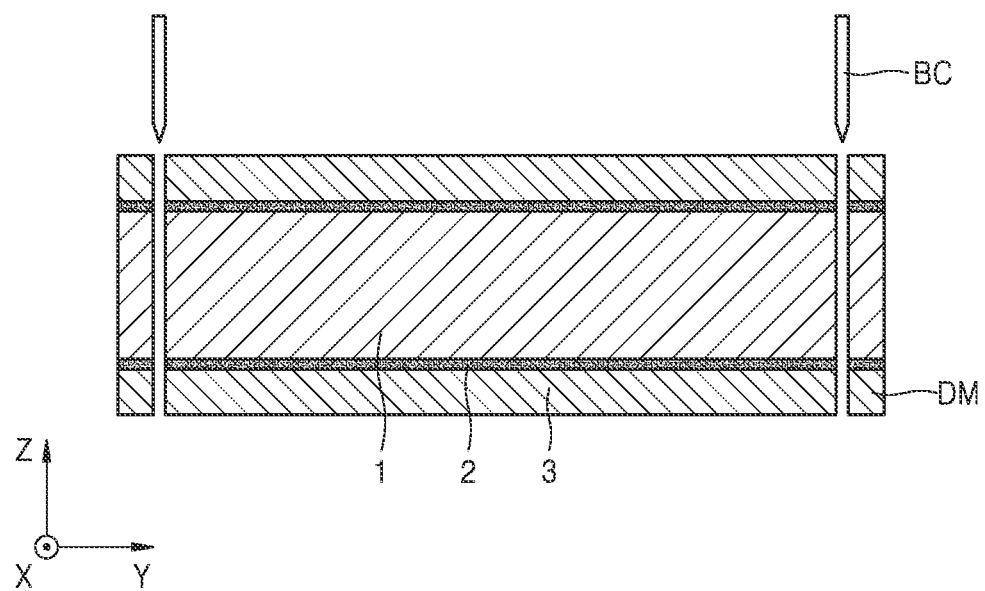
Figure 6D:
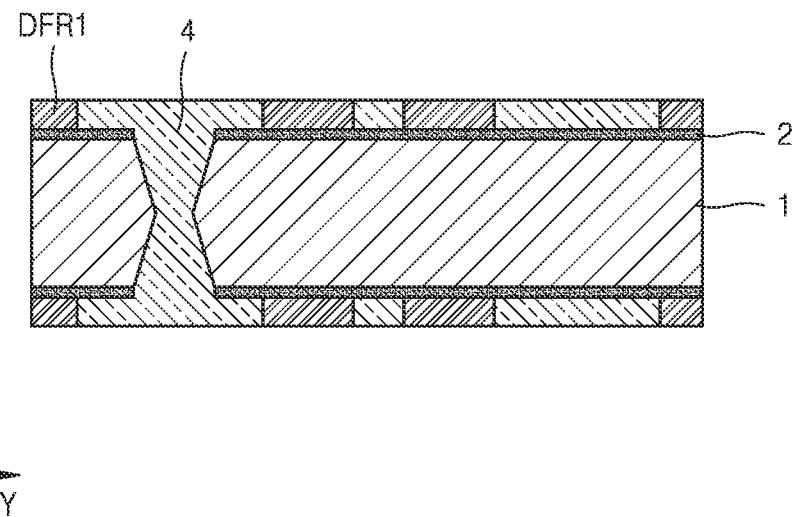
Figure 6E:
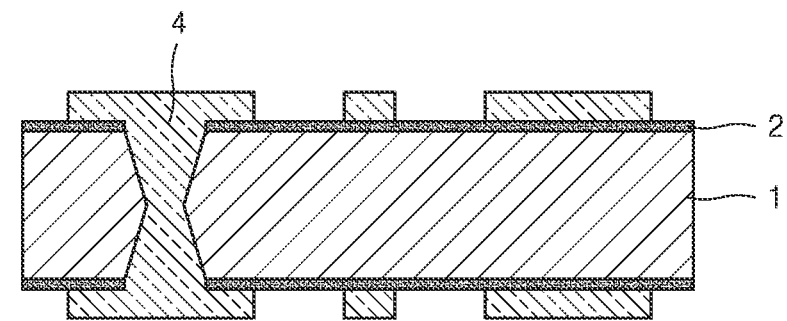
Figure 6F:
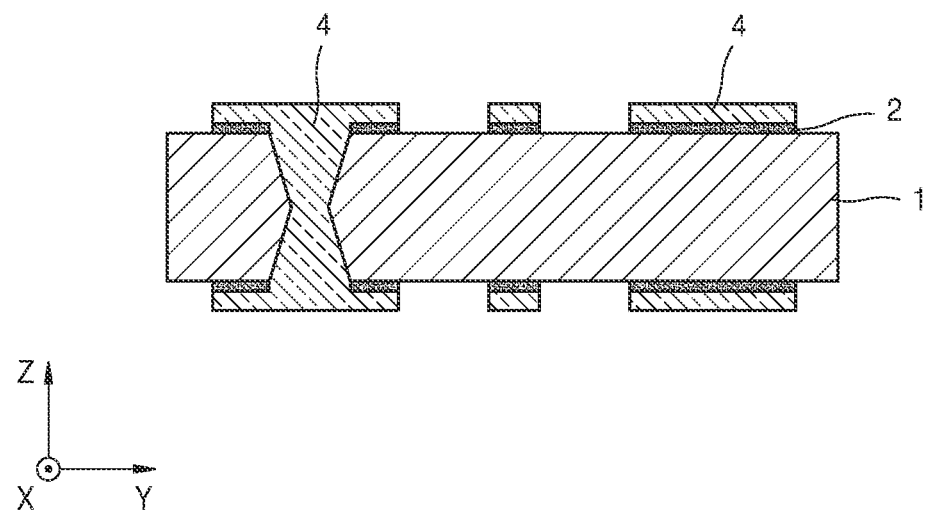
Figure 6G:
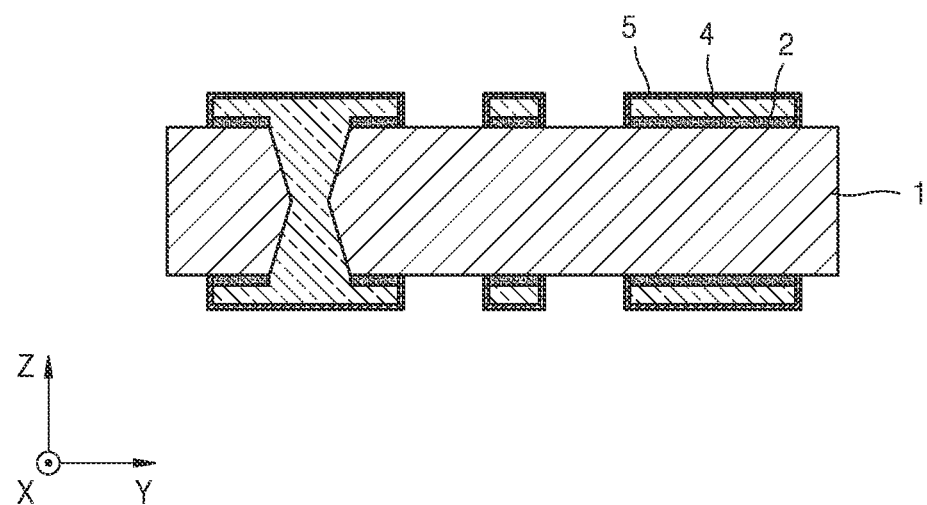
Figure 6H:
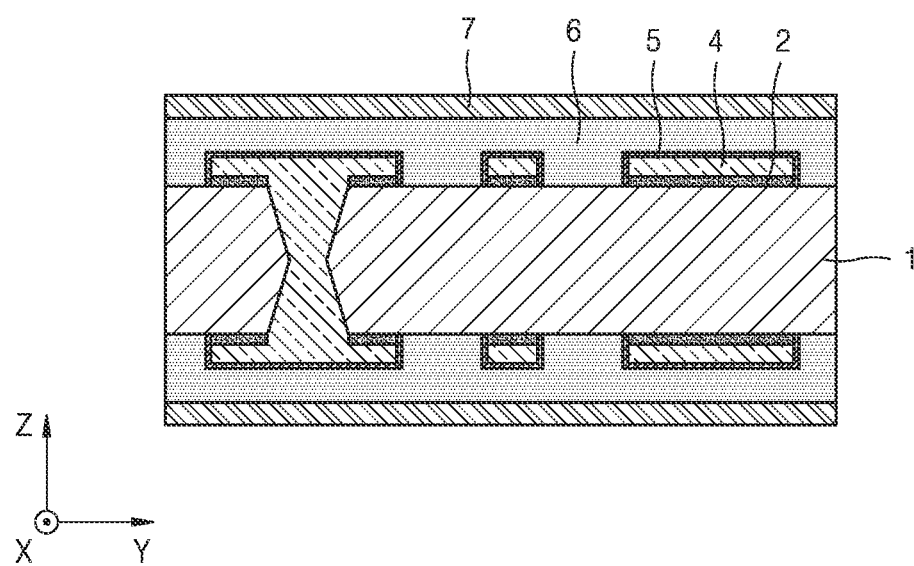
Figure 6I:
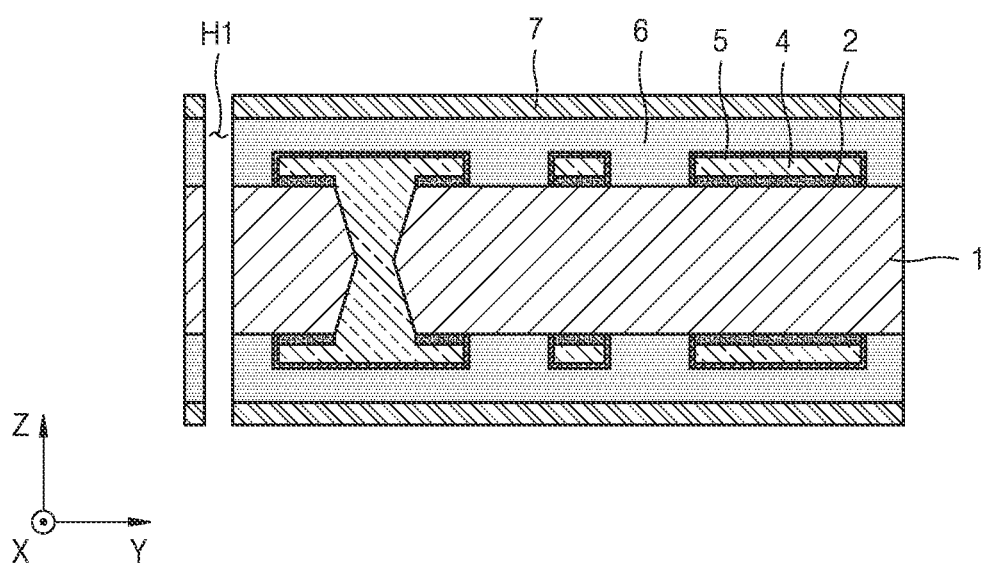
Figure 6J:
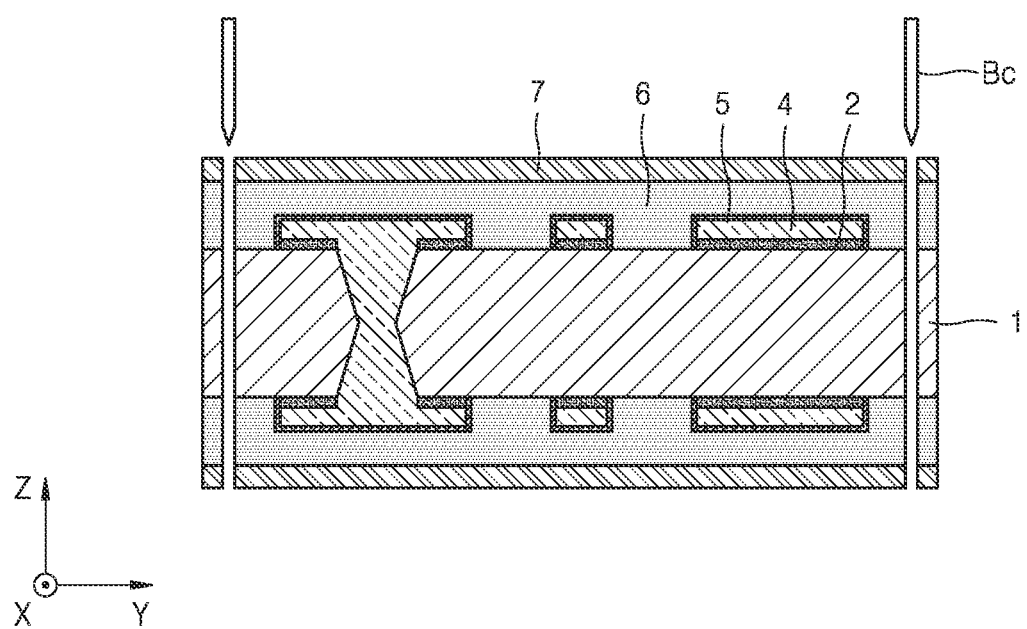
Figure 6K:
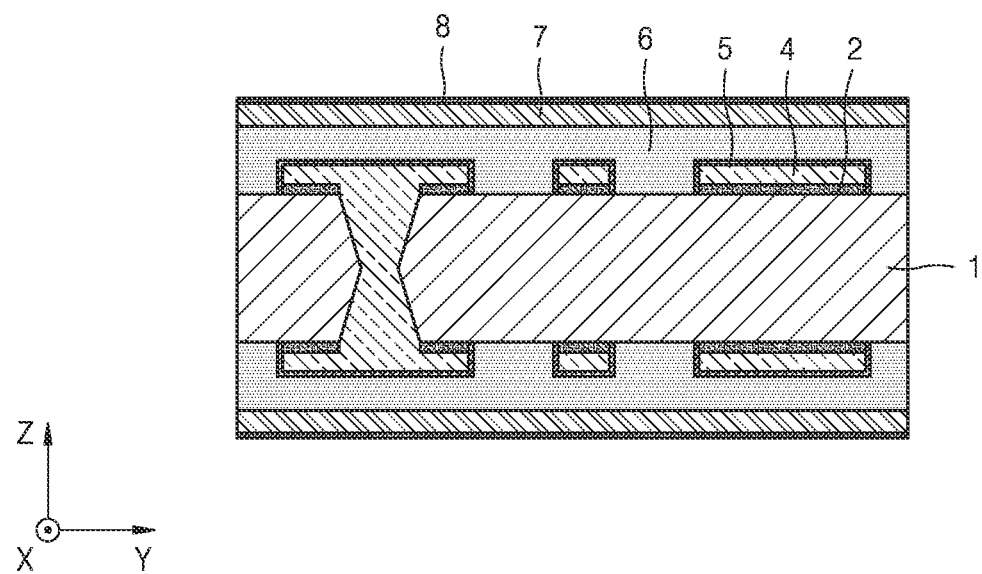
Figure 6L:
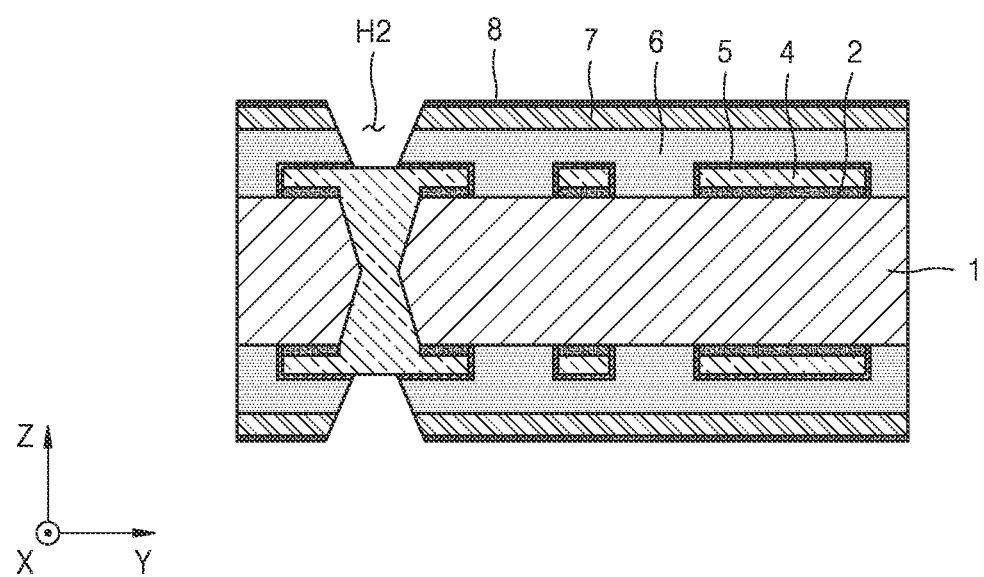
Figure 6M:
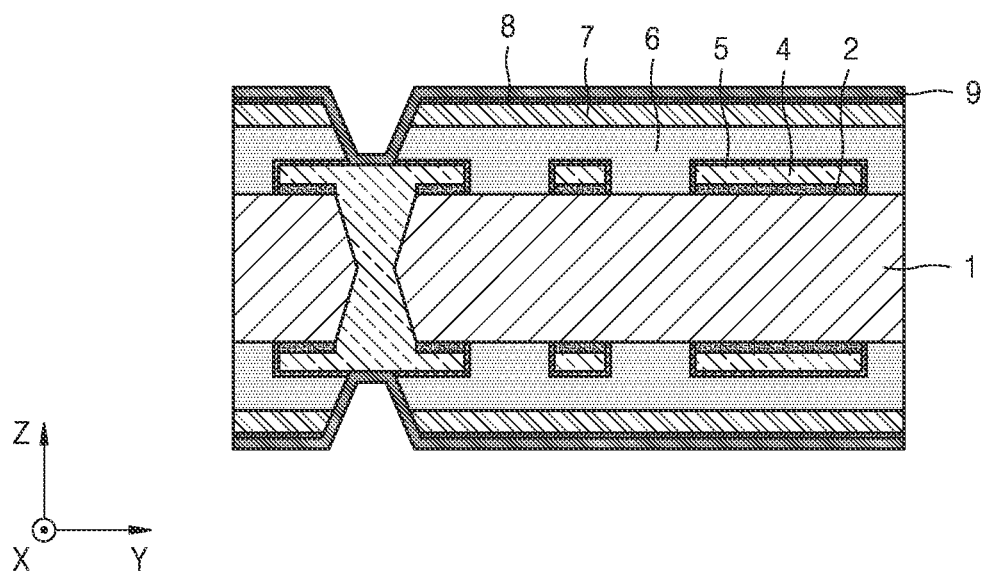
Figure 6N:
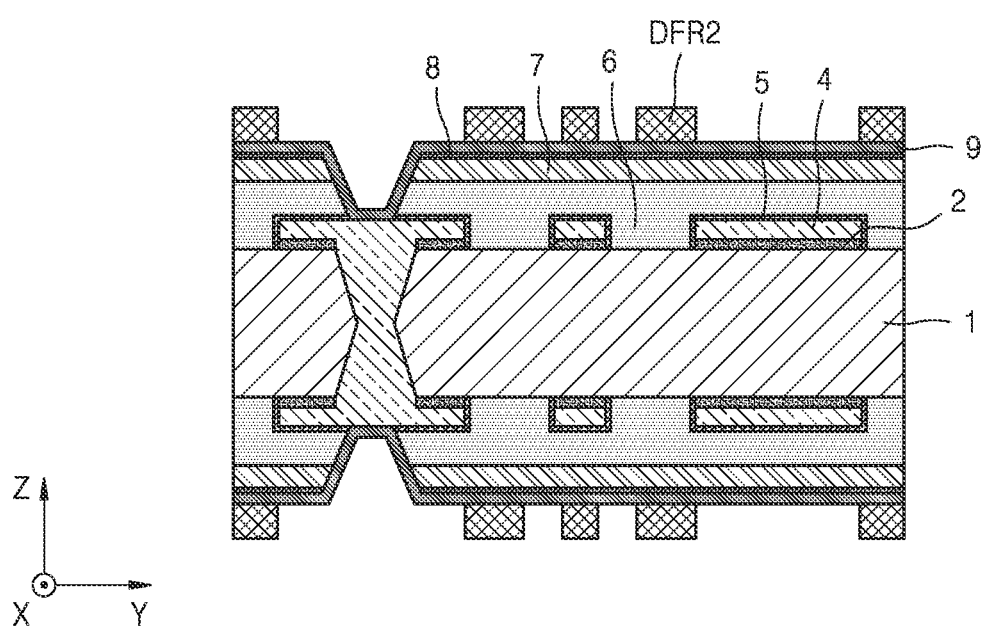
Figure 60:
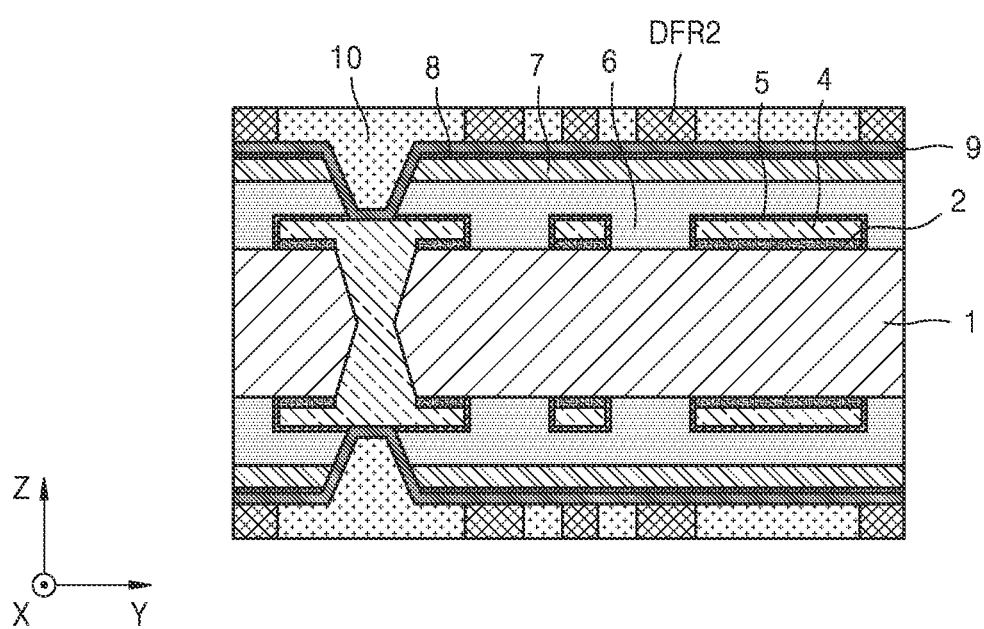
Figure 6P:
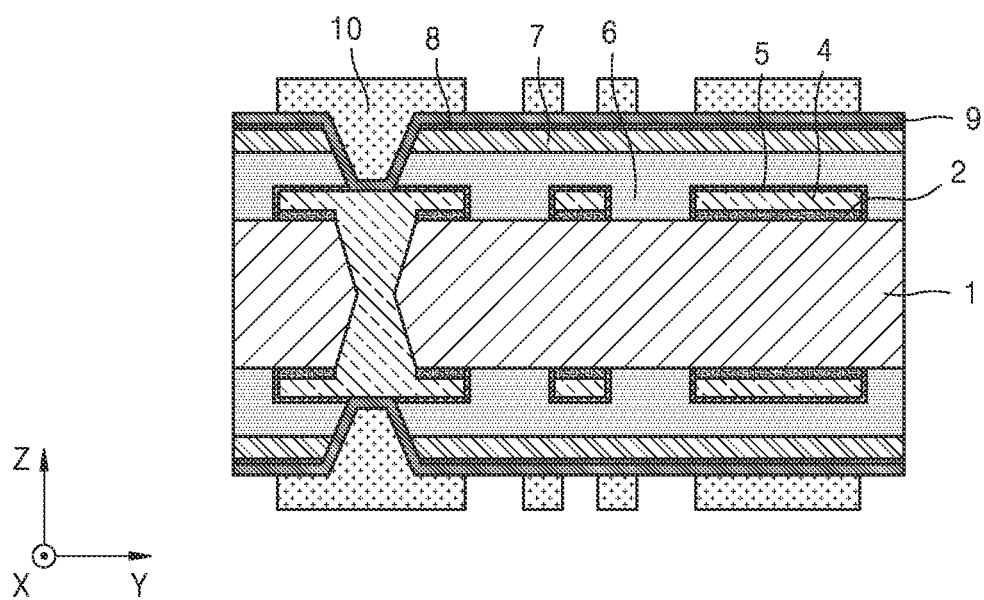
Figure 6Q:
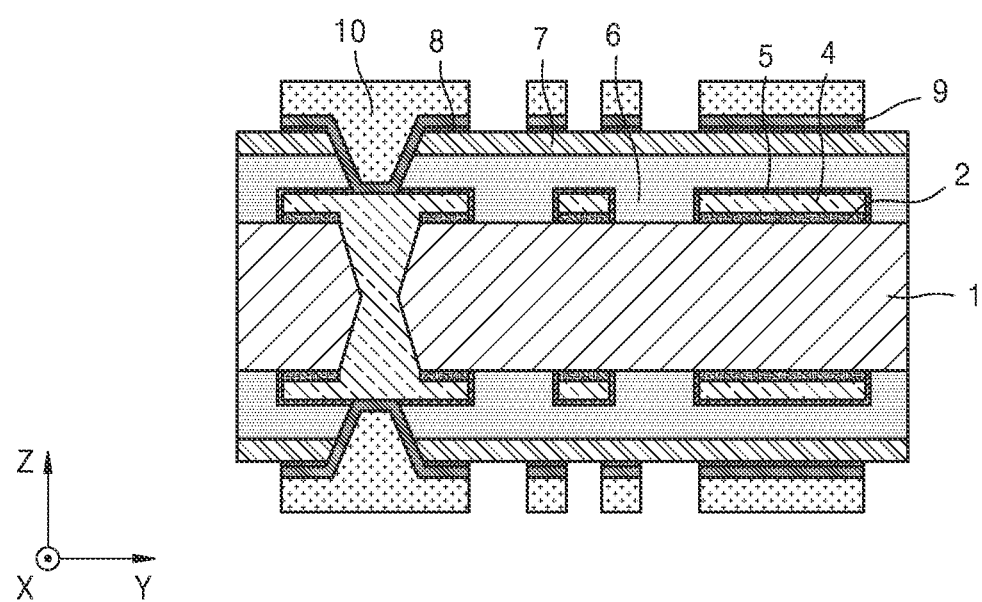
Figure 6R:
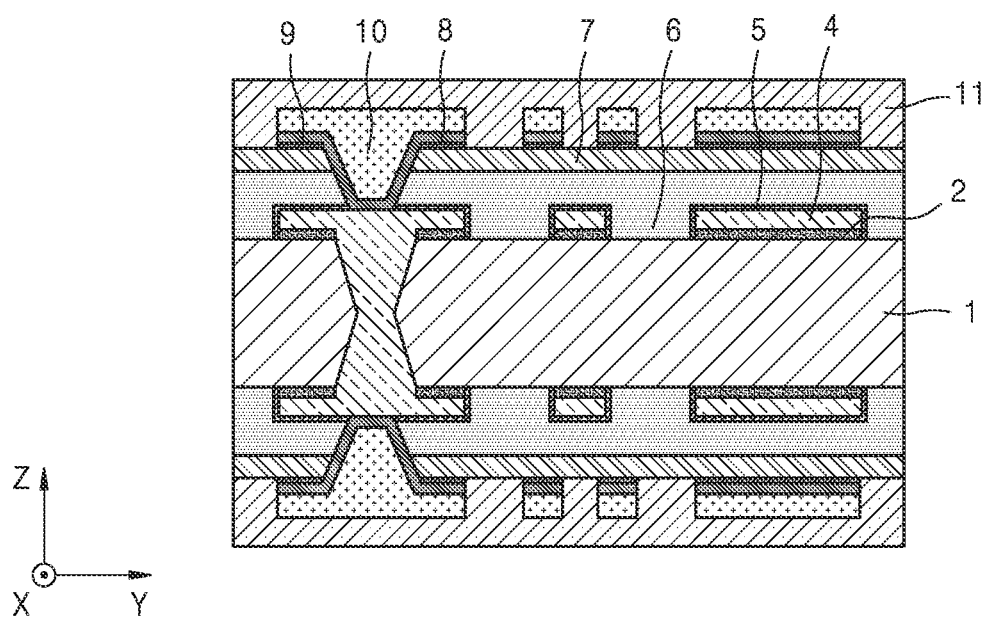
Figure 6S:
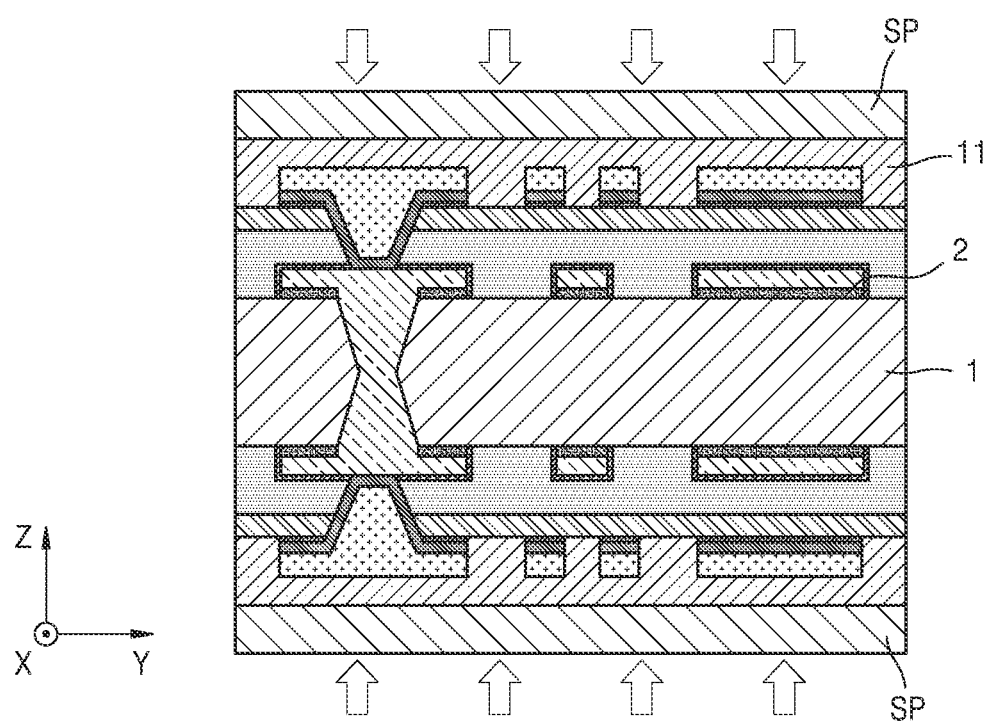
Figure 6T:
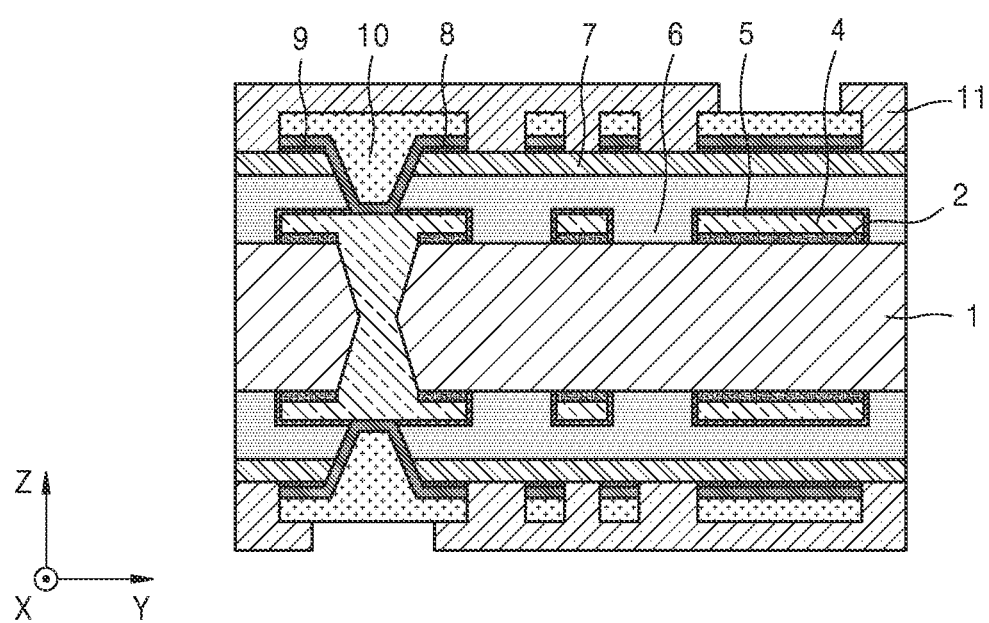

FIGS. 6A to 6T are cross-sectional views showing a manufacturing procedure for manufacturing a multilayer circuit board.

Referring to FIG. 6A, in order to manufacture a multilayer circuit board, first metal layers 2 may be laminated and attached to both surfaces of a core member 1. Here, each of the first metal layers 2 may be laminated on the core member 1 using a carrier film 3 that includes metal. In this case, the carrier film 3 may be disposed on the outer surface of the first metal layer 2. Here, each of the first metal layer 2 and the carrier film 3 may include a thin film of copper. Also, a separate adhesive layer may be disposed between the first metal layer 2 and the carrier film 3.

Referring to FIG. 6B, edges of the core member 1, the first metal layers 2, and the carrier films 3 may be removed by using a cutting device BC in a state in which the carrier films 3 and the first metal layers 2 are attached to both surfaces of the core member 1. In this case, the removed edges of the core member 1, the first metal layers 2, and the carrier films 3 may be removed as dummy members DM.

Referring to FIG. 6C, after the above process is completed, the first metal layers 2 may be heated so as to be completely laminated on the core member 1. Here, the carrier film 3 may be in a removed state or in a non-removed state. Hereinafter, for convenience of description, a case, in which the carrier film 3 is in the removed state, will be described in detail.

Referring to FIG. 6D, after the above process is completed, holes are formed in the first metal layers 2 and the core member 1 by using laser. Subsequently, electroless-plating is performed on the inside of the each of holes, and a first dry film photoresist DFR1 is applied on each of the first metal layers 2. Then, exposure and development processes are performed on the first dry film photoresist DFR1 to form a pattern. Subsequently, the pattern of the first dry film photoresist DFR1 is plated with a metal, and accordingly, a second metal layer 4 may be formed.

Referring to FIG. 6E, when the above process is completed, the first dry film photoresist DFR1 may be removed by using a stripping chemical.

Referring to FIG. 6F, subsequently, a portion of each of the first metal layers 2 may be removed by using a chemical. At this moment, the first metal layer 2 present below the pattern of the first dry film photoresist DFR1 may be removed.

Referring to FIG. 6G, after the above process, brown oxide treatment is performed on the surface of each of the second metal layers 4. Accordingly, first surface treatment layers 5 may be formed on the second metal layers 4.

Referring to FIG. 6H, after the first surface treatment layer 5 is formed as described above, a first protection layer 6 and a third metal layer 7 are disposed thereon. Accordingly, the first protection layers 6 and the third metal layers 7 may be laminated on the second metal layers 4. Here, each of the first protection layers 6 may include the same or similar material to the core member 1.

Referring to FIG. 6I, after the above process is completed, a first hole H1 may be formed to connect the pair of third metal layers 7 which are located at the outermost sides. Through the first hole H1, it is possible to check whether a pattern of the second metal layer 4 formed therein is formed.

Referring to FIG. 6J, after manufactured as described above, the edges may be removed again with a cutting device BC to achieve set dimension values. Subsequently, a separate hole for performing transfer and the like may be formed on the third metal layer 7. Here, the hole may be formed from the third metal layer 7 to the core member 1 and may be formed in the dummy regions DA described above.

Referring to FIG. 6K, brown oxide treatment may be performed again on the surface of each of the third metal layer 7. In this case, a second surface treatment layer 8 may be formed on each of the third metal layers 7.

Referring to FIG. 6I, a second hole H2 may be formed in each of the third metal layers 7. In this case, the second metal layer 4 may be exposed to the outside via the second hole H2. Here, the second hole H2 is formed by using laser, and a chemical may be supplied into the second hole H2 to remove foreign substances, burrs, and the like which occur during the laser irradiation.

Referring to FIG. 6M, a fourth metal layer 9 may be disposed on each of the second surface treatment layers 8 through electroless-plating. In this case, the fourth metal layers 9 may be located inside the second hole H2.

Referring to FIG. 6N, a second dry film photoresist DFR2 is applied on each of the fourth metal layers 9 described above, and then, a pattern may be formed through an exposure process and a development process.

Referring to FIG. 6O, a fifth metal layer 10 may be formed on each of the second dry film photoresists DFR2, in which the patterns are formed, by using an electroplating method. In this case, the fifth metal layer 10 may be located inside the pattern of the second dry film photoresist DFR2.

Referring to FIG. 6P, the second dry film photoresist DFR2 may be removed by using a stripping chemical. In this case, the fourth metal layer 9 may be exposed to the outside in a region in which the second dry film photoresist DFR2 is removed.

Referring to FIG. 6Q, the fourth metal layer 9 exposed to the outside may be etched by a liquid chemical. Subsequently, it is possible to check whether there is a defect in the pattern of the fifth metal layer 10, by using an optical salt-forming agent.

Referring to FIG. 6S, an external protection layer 11 may be formed on each of the fifth metal layers 10 and then dried in a thermal convection-type dryer at a temperature of about 80 degrees Celsius. Subsequently, the external protection layers 11 may be pressed by a pressing unit SP.

Referring to FIG. 6T, a portion of the external protection layer 11 is optically cured by irradiating the external protection layer 11 with ultraviolet rays, and an uncured another portion of the external protection layer 11 may be removed through a development process. Subsequently, the external protection layer 11 is completely cured by performing thermal curing. Accordingly, manufacturing of the multilayer circuit board is completed.

In this case, the multilayer circuit board may have a structure in which circuit patterns are formed on both surfaces thereof. The operation, which has been described above, is performed on both surfaces of the core member 1 in the same manner.

The multilayer circuit board manufacturing apparatus according to embodiments of the present disclosure makes it possible to continuously manufacture the multilayer circuit boards. The multilayer circuit board manufacturing apparatus according to embodiments of the present disclosure may be utilized in various manufacturing processes for the multilayer circuit boards.

Although the present disclosure has been described with reference to the above-mentioned embodiments, various modifications or variations are possible without departing from the subject matters and scope of the present disclosure. Therefore, the appended claims may include such modifications or variations as long as they belong to the subject matters of the present disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A multilayer circuit board manufacturing apparatus comprising:
   an uncoiler including a plurality of rollers configured so that each roller of the plurality of rollers provides at least a member different from each other roller;
   a process unit configured to perform a process on the member provided from the uncoiler;
   a member connection unit which is located between the uncoiler and the process unit and connects an end of the member to another following provided member;
   a recoiler configured to wind the member on which the process is completed in the process unit; and
   a tension adjustment unit which is located in at least one of the uncoiler, the recoiler, a region between the uncoiler and the process unit, and a region between the process unit and the recoiler, and adjusts tension of the member,
   wherein the plurality of rollers and the tension adjustment unit define a member feed path configured to substantially continuously provide the member to be processed so that the plurality of rollers provide the member along the member feed path substantially continuously from each provided member to the another following provided member.

2. The multilayer circuit board manufacturing apparatus of claim 1, wherein the tension adjustment unit comprises:
   a contact roller that moves in contact with the member; and
   a load unit which is connected to the contact roller and adjusts force that is applied to the member by the contact roller.

3. The multilayer circuit board manufacturing apparatus of claim 1, wherein the tension adjustment unit comprises a powder clutch which is connected to at least one of the uncoiler and the recoiler and maintains the tension of the member.

4. The multilayer circuit board manufacturing apparatus of claim 1, wherein the tension adjustment unit comprises a speed adjustment unit which is located in at least one of the uncoiler and the recoiler and adjusts a speed of at least one of the uncoiler and the recoiler.

5. The multilayer circuit board manufacturing apparatus of claim 1, further comprising a position adjustment unit which is located between the uncoiler and the recoiler and adjusts a position of the member.

6. The multilayer circuit board manufacturing apparatus of claim 1, further comprising another member connection unit which is located between the recoiler and the process unit and connects an end of the member to an end of a new member.

7. The multilayer circuit board manufacturing apparatus of claim 1, further comprising stopper units which are located between the uncoiler and the process unit and between the recoiler and the process unit and prevent the member from moving.

8. The multilayer circuit board manufacturing apparatus of claim 1, further comprising a transfer roller which is located between the uncoiler and the recoiler and is in contact with the member when the member is transferred.

9. The multilayer circuit board manufacturing apparatus of claim 8, wherein the transfer roller comprises:
a roller body; and
a protrusion located on the roller body and protruding from the roller body.

10. The multilayer circuit board manufacturing apparatus of claim 9, wherein the protrusion comprises:
a pair of first protrusions located at ends of the roller body; and
a second protrusion which is located between the first protrusions and has a width less than a width of each of the first protrusions.

11. The multilayer circuit board manufacturing apparatus of claim 8, wherein the transfer roller is provided in plurality, and
the plurality of transfer rollers comprise:
a first transfer roller which faces a first surface of the member; and
a second transfer roller which faces a second surface of the member and blocks, in conjunction with the first transfer roller, a product region of the member from the outside.

12. The multilayer circuit board manufacturing apparatus of claim 11, wherein the first transfer roller and the second transfer roller are arranged perpendicular to the ground.

13. The multilayer circuit board manufacturing apparatus of claim 1, wherein the process unit performs at least one of a development process, an etching process, a brown oxide process, a plating process, and an exfoliating process.

14. The multilayer circuit board manufacturing apparatus of claim 1, wherein the process unit comprises:
a liquid chemical supply unit configured to supply a liquid chemical to the member;
a plurality of first rollers configured to transfer the member; and
a second roller which prevents the liquid chemical supplied from the liquid chemical supply unit from moving while guiding the liquid chemical supplied from the liquid chemical supply unit, and which has a diameter less than a diameter of each of the first rollers.

* * * * *